(12) United States Patent
Murayama et al.

(10) Patent No.: US 7,741,776 B2
(45) Date of Patent: Jun. 22, 2010

(54) ORGANIC EL DISPLAY DEVICE HAVING A PROTECTION LAYER

(75) Inventors: Koji Murayama, Shiga (JP); Shinichi Abe, Shiga (JP)

(73) Assignee: Kyocera Corporation, Kyoto (JP)

( * ) Notice: Subject to any disclaimer, the term of this patent is extended or adjusted under 35 U.S.C. 154(b) by 1030 days.

(21) Appl. No.: 11/476,456

(22) Filed: Jun. 27, 2006

(65) Prior Publication Data

US 2007/0001596 A1    Jan. 4, 2007

(30) Foreign Application Priority Data

Jun. 29, 2005   (JP) ............................. 2005-189695
May 25, 2006   (JP) ............................. 2006-145736

(51) Int. Cl.
*H01L 51/50*   (2006.01)
*H01L 51/52*   (2006.01)

(52) U.S. Cl. ...................... 313/512; 313/504; 313/506

(58) Field of Classification Search ......... 313/503–512; 428/690
See application file for complete search history.

(56) References Cited

U.S. PATENT DOCUMENTS

2005/0280356 A1   12/2005   Murayama et al.

FOREIGN PATENT DOCUMENTS

| JP | 09-122924 | 5/1997 |
| JP | 09-257655 | 10/1997 |
| JP | 200455159 | 2/2004 |
| KR | 1020040010095 | 1/2004 |

*Primary Examiner*—Joseph L Williams
(74) *Attorney, Agent, or Firm*—Volpe and Koenig PC

(57) ABSTRACT

Provided is an organic EL (electroluminescence) display including: a substrate; a plurality of organic EL elements arranged on the substrate; an insulation member disposed between the adjacent organic EL elements; and a first protection layer which is sequentially formed from a region between the lower layer electrode and the function layer of the organic EL element to the surface of the insulation member and includes fluorine.

15 Claims, 10 Drawing Sheets

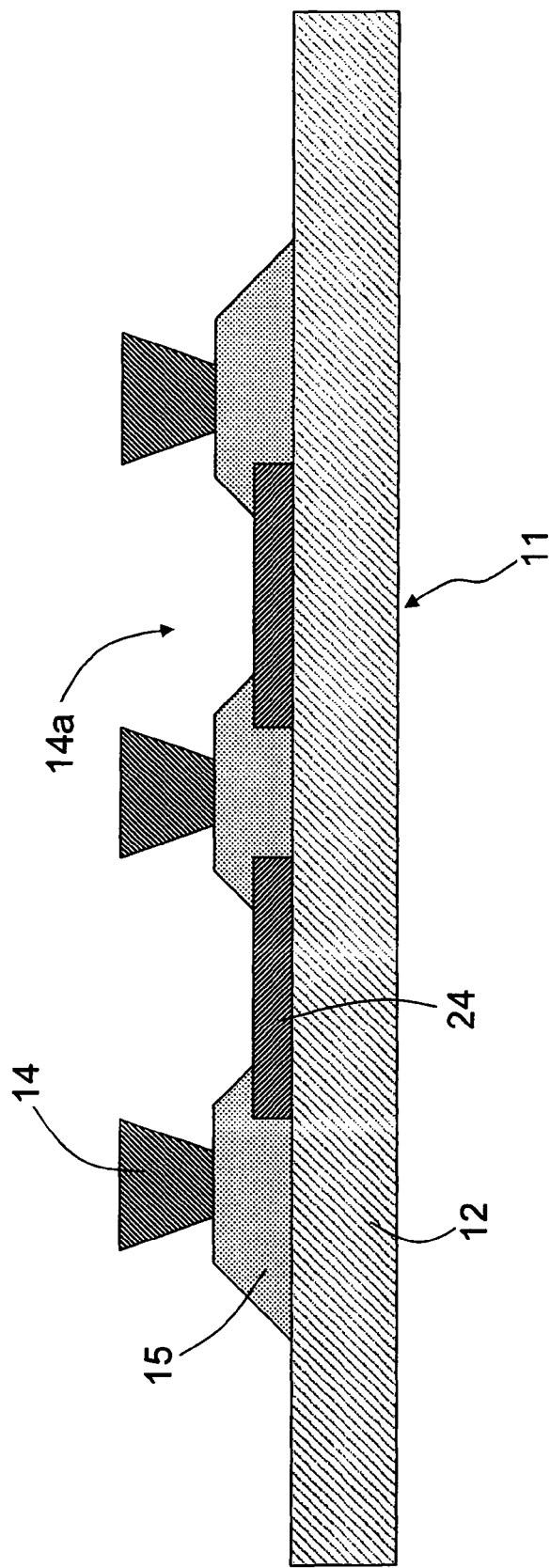

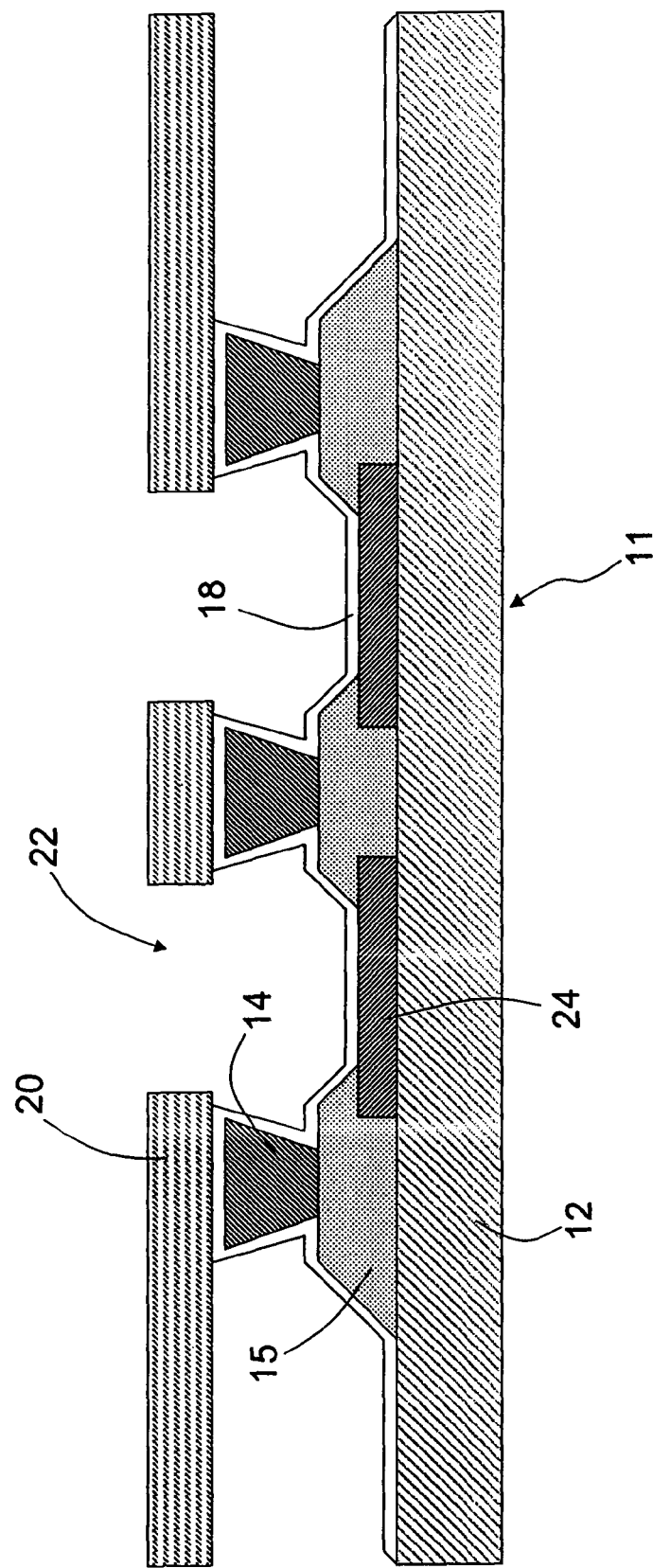

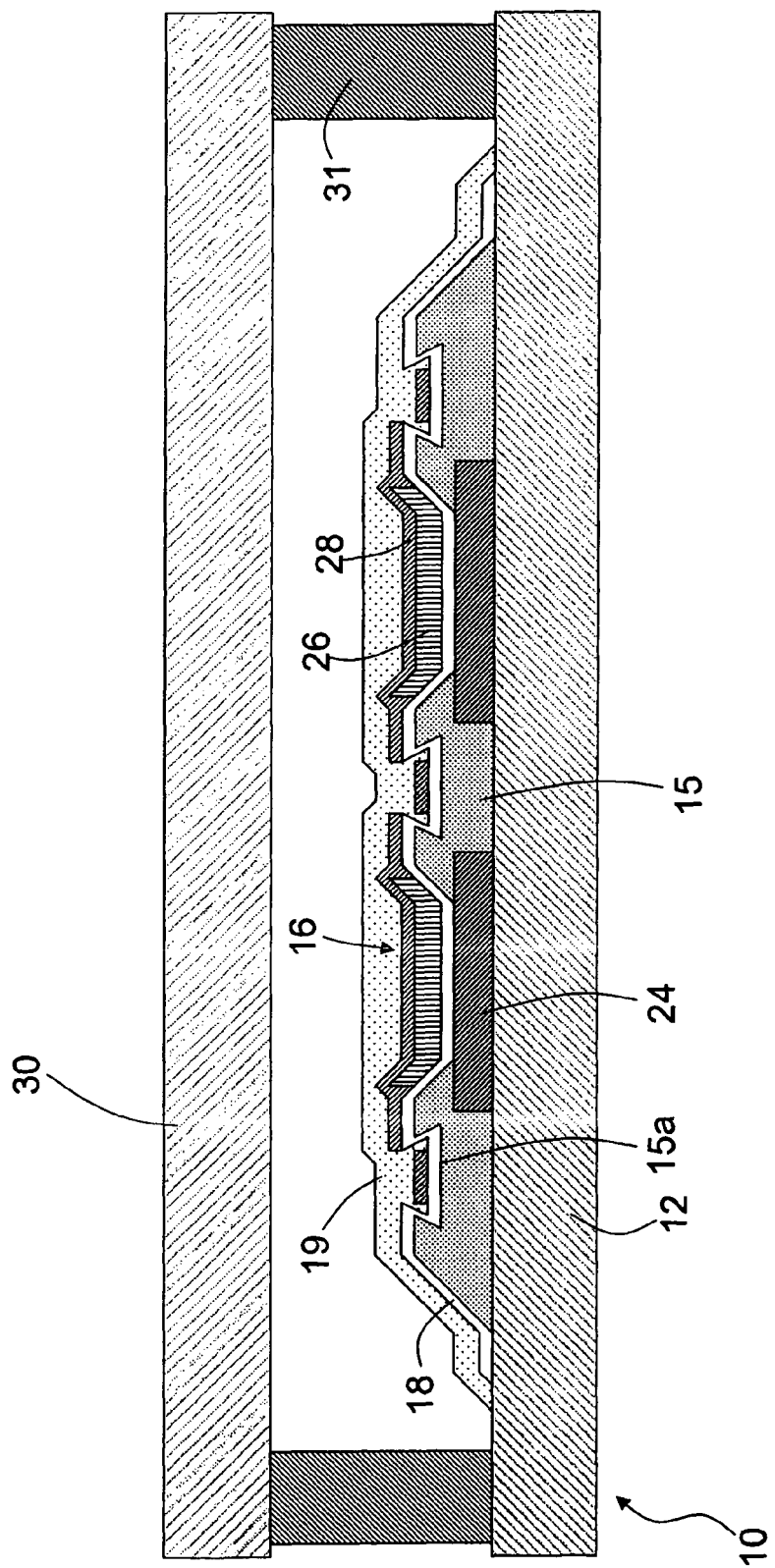

ORGANIC EL DISPLAY DEVICE HAVING A PROTECTION LAYER

BACKGROUND OF THE INVENTION

1. Field of the Invention

The present invention relates to an organic EL (electroluminescence) display.

2. Description of the Related Art

Recently, an organic EL display including an OLED (Organic Light Emitting Diode) has drawn attention. Thus, the organic EL display has been used as a display for a variety of products such as mobile phones or digital cameras.

The conventional organic EL display has a structure comprising a substrate, a plurality of organic EL elements arranged on the substrate, a barrier rib which is disposed between the adjacent organic EL elements and is disposed in order to surround each organic EL element, a protection layer which covers the organic EL elements, and a sealing member (a sealing substrate) for forming a sealed space between the substrate and the sealing member.

The organic EL element has a structure in which a lower layer electrode, an organic layer including an emission layer, and an upper layer electrode are sequentially laminated on the substrate. When power is supplied to the lower layer electrode and the upper layer electrode, hole and electron are injected towards the emission layer from the lower layer electrode side and the upper layer electrode side, respectively. The injected hole and electron are recombined in the emission layer to emit a specific light.

In general, the organic EL display is formed in the order of the substrate, the lower layer electrode, the barrier rib, the organic layer, the upper layer electrode, and the protection layer.

If the organic layer and/or the upper layer electrode are formed by using a deposition mask, the barrier rib serves to support the deposition mask. If the organic layer and the electrodes are formed through a deposition method without using the deposition mask, the barrier rib itself functions as the deposition mask. If the organic layer and the like are formed by using other methods excluding the deposition method (e.g. an inkjet method), the barrier rib can enhance electrical insulation between the adjacent pixels.

The barrier rib is formed of an organic material such as a novolak or acrylic-based resin, or a material including the organic material. Since the organic material can relatively easily absorb moisture, the barrier rib can easily absorb moisture from external air in the process of forming the organic layer, the upper layer electrode, and the protection layer. Thus, when the manufacturing process of the organic EL display is completed, there is a case in which much moisture is absorbed into the barrier rib. If the absorbed moisture is evaporated due to a change in an internal pressure of the display and the like, the evaporated moisture may enter between the barrier rib and the protection layer so as to reach the organic layer. In this case, the lifespan of the organic EL element may be shortened.

Meanwhile, Japanese Unexamined Patent Application Publication No. 2005-122924 and Japanese Unexamined Patent Application Publication No. 2003-257655 propose a technique in which a surface of a barrier rib is fluorinated by exposing the surface of the barrier rib formed of a resin to a fluoride gas.

However, basically, in the technique disclosed in Japanese Unexamined Patent Application Publication No. 2005-122924 and Japanese Unexamined Patent Application Publication No. 2003-257655, the surface of the barrier rib formed of a resin is fluorinated. Therefore, if the moisture, which is absorbed by the barrier rib before a fluorination process is performed after the barrier rib is formed, is evaporated after the manufacturing process of the organic display is completed, there is still high possibility in that the evaporated moisture is absorbed between the fluorinated surface and an inner area of the surface so as to reach the organic layer. Further, impact of the fluorination process against the organic EL element has not been taken into account. Accordingly, there has been a demand for an organic EL display having a novel structure in which the lifespan of the organic EL element can be further improved.

SUMMARY OF THE INVENTION

The present invention provides an organic EL display comprising: a substrate; a plurality of organic EL elements arranged on the substrate; and an insulation member disposed between the adjacent organic EL elements. The organic EL element may include: a lower layer electrode; an upper layer electrode; and a function layer interposed between the lower layer electrode and the upper layer electrode and having an organic emission layer. In addition, the organic EL element of the present invention may further comprises a first protection layer which is sequentially formed from a region between the lower layer electrode and the function layer of the organic EL element to the surface of the insulation member, and includes fluorine. Preferably, the thickness of the first protection layer may be determined to be 10 nm or less in the region between the upper layer electrode and the function layer. The first protection layer may be formed of a water-repellent material such as a silicon resin or a vinyl chloride, as a material other than fluorine.

BRIEF DESCRIPTION OF THE DRAWINGS

The above and other features and advantages of the present invention will become more apparent by describing in detail exemplary embodiments thereof with reference to the attached drawings in which:

FIG. 2A is a cross-sectional view illustrating a prepared display substrate;

FIG. 2C is a cross-sectional view when a mask is disposed;

FIG. 5 is a cross-sectional view illustrating an organic EL display according to a second embodiment of the invention.

Figure 1A:
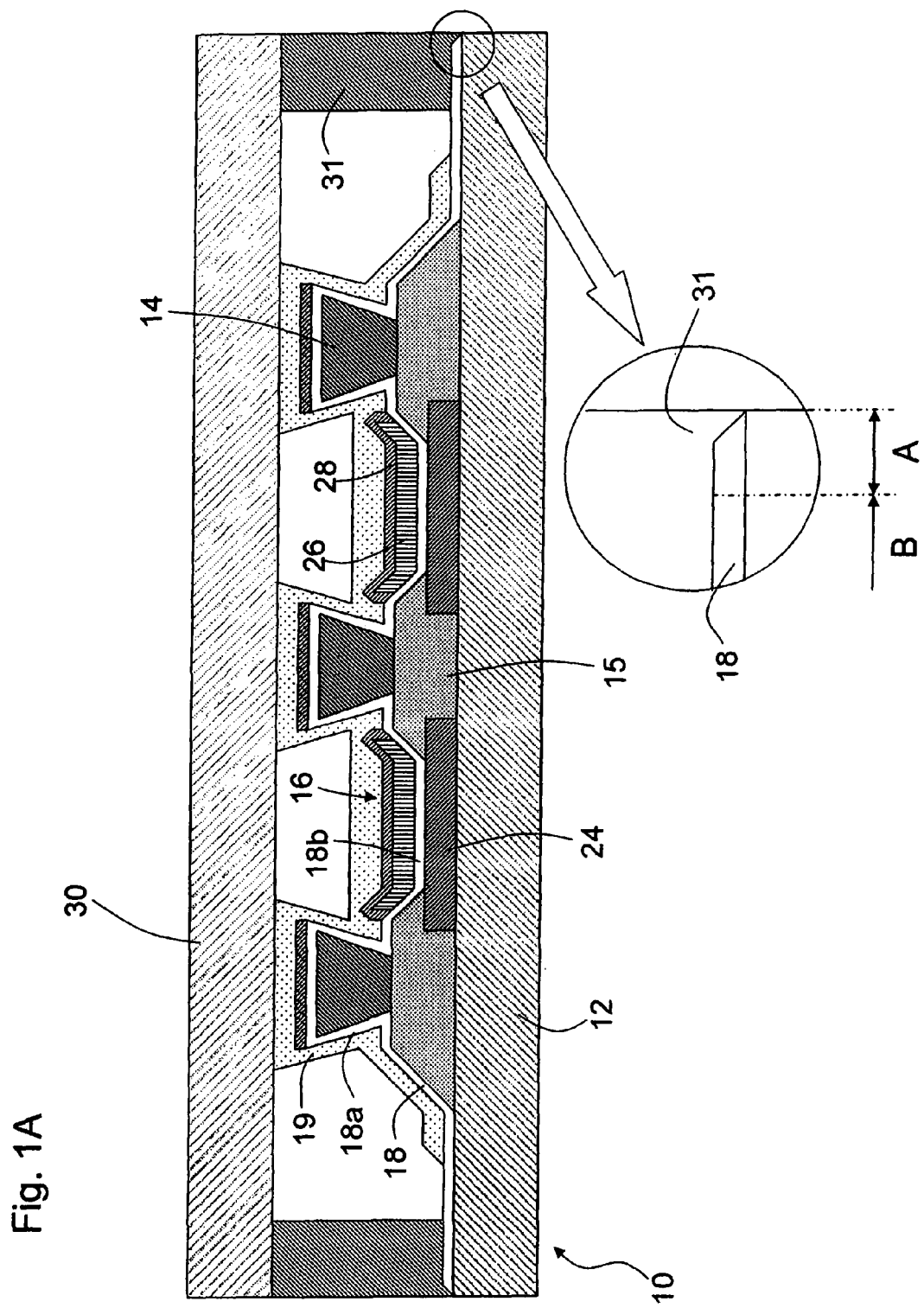
FIG. 1A is a cross-sectional view illustrating an organic EL display according to a first embodiment of the invention.

10: Organic EL display
11: Display substrate
12: Substrate
14: Barrier rib
14a: Opening
15: interlayer insulation film
15a: concave portion 16: Organic EL element
18: Water-repellent layer
18a: Covering portion
18b: Interposed portion
19: Protection layer
20: Mask
22: Hole
24: Lower layer electrode
26: Organic layer
28: Upper layer electrode
30: Sealing substrate
31: Sealing material

DETAILED DESCRIPTION OF THE INVENTION

First Embodiment

Organic EL Display

Now, an organic EL display according to a first embodiment of the present invention will be described with reference to the accompanying drawings.

Referring to FIG. 1A, an organic EL display 10 includes a substrate 12, a barrier rib 14 serving as an insulation member which is disposed on the substrate 12 and has a plurality of openings 14a. The organic EL display 10 also includes a plurality of organic EL elements 16, each of which is formed within each of the openings 14a, and a water-repellent layer 18 which is formed on a surface of the barrier rib 14 and a lower layer electrode 24 constituting the organic EL element 16 and serves as a first protection layer. The organic EL elements 16 further includes a protection layer 19 which functions as a second protection layer for protecting the organic EL element 16, and a sealing substrate 30 which forms a sealed space between the substrate 12 and the sealing substrate 30.

The substrate 12 functions as a support base material for supporting the barrier rib 14, the organic EL element 16, and the protection layer 19 and the like formed on the upper surface side of the substrate 12. In the case of a bottom emission type organic EL display in which light is emitted to the substrate 12 side, the substrate 12 is formed of a transparent or semitransparent material. On the other hand, in the case of a top emission type organic EL display in which light is emitted from the protection layer 19 side, the substrate 12 may be formed of not only the transparent or semitransparent material but also an opaque material. In general, the substrate 12 is formed of glass.

Figure 1B:
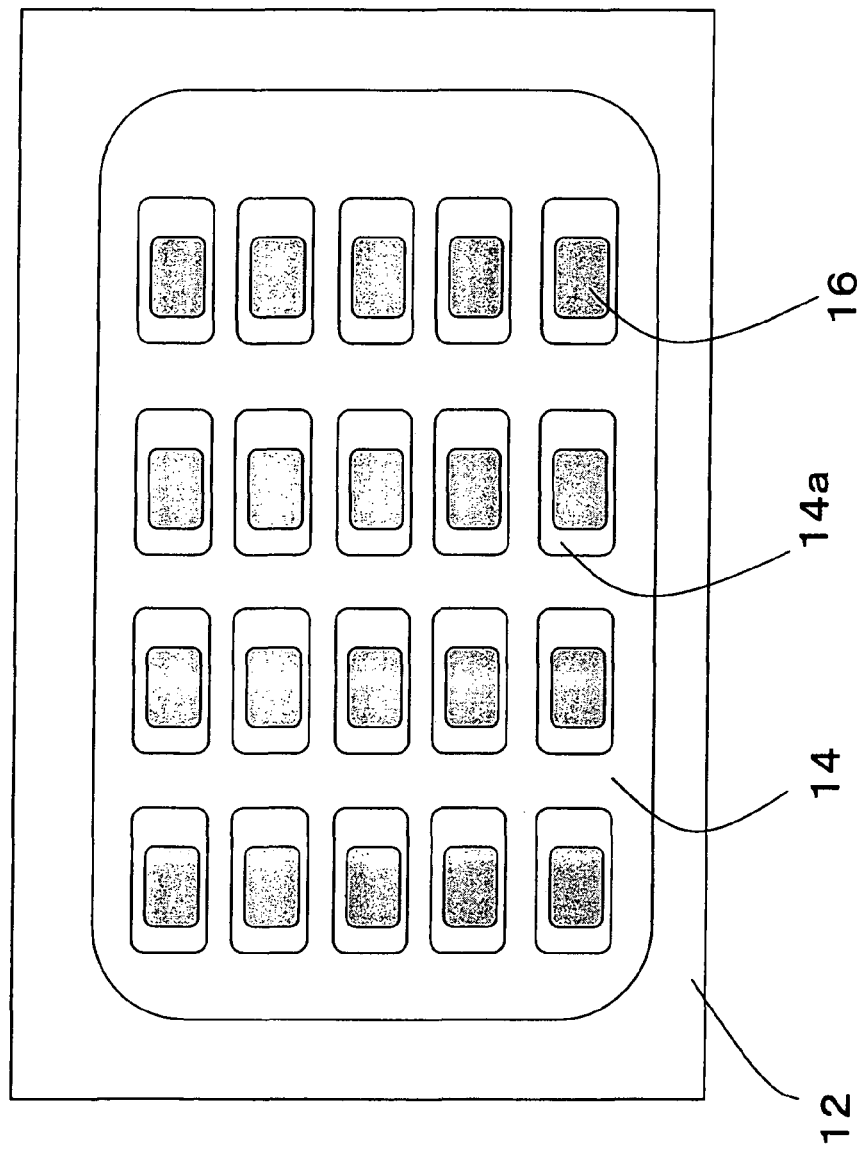
FIG. 1B is a top plan view illustrating a shape of a barrier rib of the organic EL display.

As shown in FIG. 1B, the barrier rib 14 has the openings 14a, which surrounds the organic EL element 16, disposed in a matrix form. Although each of the organic EL elements 16 is surrounded by the barrier rib 14 in the present embodiment, the organic EL element 16 does not have to be surrounded thereby. In addition, although the openings 14a of the barrier rib 14 are disposed in a matrix form, for example, if a passive type organic EL display is used, the openings 14a may be disposed in a stripe form by disposing the barrier rib 14 in a stripe form.

The barrier rib 14 prevents the adjacent organic EL elements 16 from short circuiting with each other. When the organic EL elements 16 are formed by a mask deposition, the barrier rib 14 functions as a supporter that supports a deposition mask. In addition, since the barrier rib 14 has an upper portion wider than a lower portion, the barrier rib 14 itself may function as a mask.

The barrier rib 14 is formed of a material, for example, such as a photosensitive negative type resist. In general, the barrier rib 14 is formed of an organic material such as a novolak or acrylic-based resin, or an organic resin. Therefore, the barrier rib 14 has a property which easily absorbs moisture in an atmosphere. The barrier rib 14 is generally formed by a conventional well-known photolithography method, a spin coating method, and the like.

The organic EL element 16 is disposed in each of the openings 14a of the barrier rib 14. The organic EL element 16 is classified into three types, that is, a red light emission type, a blue light emission type, and a green light emission type (a white light emission type is optionally added).

The organic EL element 16 generally includes a lower layer electrode 24 (an anode electrode in the present embodiment), an upper layer electrode 28 (a cathode electrode in the present embodiment), and an organic layer 26 serving as a function layer which is interposed between the lower layer electrode 24 and the upper layer electrode 28. Further, the organic EL element 16 further includes a water-repellent layer 18 which is interposed between the organic layer 26 and the lower layer electrode 24 to be described below.

The organic layer 26 includes an organic light emitting layer. In the organic layer 26, a hole injection layer and/or a hole transport layer may be properly interposed between the lower layer electrode 24 and the organic light emitting layer by considering adherence property between the organic light emitting layer and the lower layer and between upper layer electrodes 24 and 28. An electron injection layer and/or an electron transport layer may be interposed between the upper layer electrode 28 and the organic light emitting layer. In the present embodiment, the organic layer 26 includes the organic light emitting layer, the hole transport layer, and the electron transport layer. Although the lower layer electrode 24 is defined as an anode electrode, and the upper layer electrode 28 is defined as a cathode electrode in the present embodiment, vice-versa is also possible.

In order to carry out a display function, the organic light emitting layer emits light with a predetermined luminance by using energy generated when hole and electron respectively provided from the lower layer electrode 24 and the upper layer electrode 28 towards the organic light emitting layer are recombined.

The organic light emitting layer is formed of an organic material which emits light at a predetermined wavelength by applying current, such as $Alq_3$, anthracene, $Znq_2$, $Balq_2$, $Almq_3$, $Tb(acac)_3$, DCJTB, C545T, perylene, quinacridone derivatives, rubrene, or rhodamine. The hole transport layer or the electron transport layer are formed of a material such as NPB, TPD, or $Alq_3$.

As for materials of the lower layer electrode 24 and the upper layer electrode 28, if the organic EL element 16 is a top emission type, the upper layer electrode 28 is formed of a transparent or semi-transparent metal material, and the lower layer electrode 24 is formed of a metal material having a good reflectivity. On the other hand, if the organic EL element 16 is a bottom emission type, the upper layer electrode 28 is formed of a metal material having a good reflectivity, and the lower layer electrode 24 is formed of a transparent or semi-transparent metal material. As for the transparent or semi-transparent metal material, a metal material such as ITO, Mg, Ca, Ag, Li and their alloys are appropriately used. As for the metal material having a good reflectivity, a metal material such as Al, Cu, Au, Ag and their alloys are appropriately used.

The organic EL element 16 is formed by using a conventional well-known thin film formation technology such as a vacuum deposition method, a CVD, a spin coating method, or an inkjet method. An interlayer insulation film 15 is interposed between the barrier rib 14 and the substrate 12.

The interlayer insulation film 15 is partially interposed between the lower layer electrode 24 and the upper layer electrode 28, so as to prevent short circuit of the lower layer electrode 24 and the upper layer electrode 28. The interlayer insulation film 15 is formed of an inorganic material (e.g. a silicon oxide film, a silicon nitride film, etc) or a novolak or acrylic-based organic resin having an insulation property, and is formed by using the conventional well-known thin film formation technology.

The water-repellent layer 18 is disposed on the surface of the barrier rib 14. The water-repellent layer 18 includes a covering portion 18a that covers the upper surface and the lateral surfaces of the barrier rib 14, and an interposed portion 18b that is interposed between the lower layer electrode 24 and the organic layer 26. The covering portion 18a and the interposed portion 18b are sequentially connected. In the present embodiment, the water-repellent layer 18 is deposited to the entire substrate 12, and formed up to an end portion of the substrate 12.

The water-repellent layer 18 generally restrains not only the barrier rib 14 from absorbing moisture contained in the external air but also the absorbed moisture from reaching the organic layer 26 of the organic EL element 16. Accordingly, the water-repellent layer 18 can easily repel moisture as its name indicates. Preferably, a contact angle of a material constituting the water-repellent layer 18 against water is from 80° to 120°.

The thickness of the water-repellent layer 18 is determined to be from 0.5 nm, to 20 nm. However, the thickness of the interposed portion 18b is preferably determined to be 10 nm or less. The reason is that, even if water-repellence is improved with respect to the organic layer 26 when the thickness of the interposed portion 18b is greater than 10 nm, power consumption increases because an electrical resistance of the organic EL element 16 itself increases in the presence of the interposed portion 18b.

Further, it is preferable that, comparing a region A (a region within 1 μm from the end portion of the substrate 12) near the end of the substrate 12 with a region B disposed inwards the region A, the thickness of the water-repellent layer 18 is thinner in a portion of the region A (see the enlarged cross-sectional view of FIG. 1A). This is because, if the thickness of the water-repellent layer 18 is thin in the region A, inner stress of the water-repellent layer 18 in the region A is reduced, and thus the water-repellent layer 18 can be prevented from peeling.

As a water-repellent material constituting the water-repellent layer 18, a material such as a fluorine-based resin, a silicon resin, a vinyl chloride, etc, which has a water-repellent property and an appropriate insulation property capable of preventing the adjacent organic EL elements 16 from short circuiting, is used. When the water-repellent layer 18 is formed of the fluorine-based resin, it is preferable that the water-repellent layer 18 satisfies the composition of $CH_XF_Y$ ($0 \leq x \leq 1$, $0.3 \leq y \leq 2$, $1.3 \leq x+y \leq 2$). The $CF_X$ or $CH_XF_Y$ film has a property similar to PolyTetraFluoroEthylene.

The protection layer 19 is deposited on the water-repellent layer 18 and the organic EL element 16. The protection layer 19 protects the organic EL element 16 from external moisture, and is formed of a SiN-based inorganic material or a SiO-based inorganic material. The protection layer 19 is generally formed by using the conventional well-known thin film formation technology (e.g. a vacuum deposition method, a CVD method, etc).

The sealing substrate 30 that forms the sealed space between the substrate 12 and the sealing substrate 30 is disposed on the substrate 12, with a sealing material 31 being interposed therebetween. The sealing substrate 30 protects the organic EL element 16 from an external object or the external air. When the top emission type organic EL element is used, the sealing substrate 30 is formed of a transparent material (e.g. glass, polyimide, etc). On the other hand, if the bottom emission type organic EL element is used, the sealing substrate 30 may be formed of an opaque material. Further, the sealing material 31 bonds the substrate 12 to the sealing substrate 30, and surrounds a pixel region.

Manufacturing Method of Organic EL Display

Now, a manufacturing method of the aforementioned organic EL display will be described with reference to FIGS. 2A through 2E.

(1) First, as illustrated in FIG. 2A, a display substrate 11 including a substrate 12, a barrier rib 14 having a plurality of openings 14a, and a lower layer electrode 24 formed within each of the openings 14a is prepared.

For example, if the lower layer electrode 24 is formed of a metal material such as ITO or Al, in the process of forming the lower layer electrode 24, the metal material is formed with a predetermined thickness by using the conventional well-known thin film formation technology, specifically, the deposition method or the sputtering method, and is then processed to have a specific pattern by using a technology such as a photolithography or an etching. In the process of forming the barrier rib 14, a photosensitive photoresist (e.g. a novolak-based resin, an acrylic-based resin, etc) is coated on the substrate with a predetermined thickness by using the spin coating method, and is then exposed to light to have a specific pattern. Thereafter, an unnecessary portion is removed by liquid chemical etching.

Figure 2B:
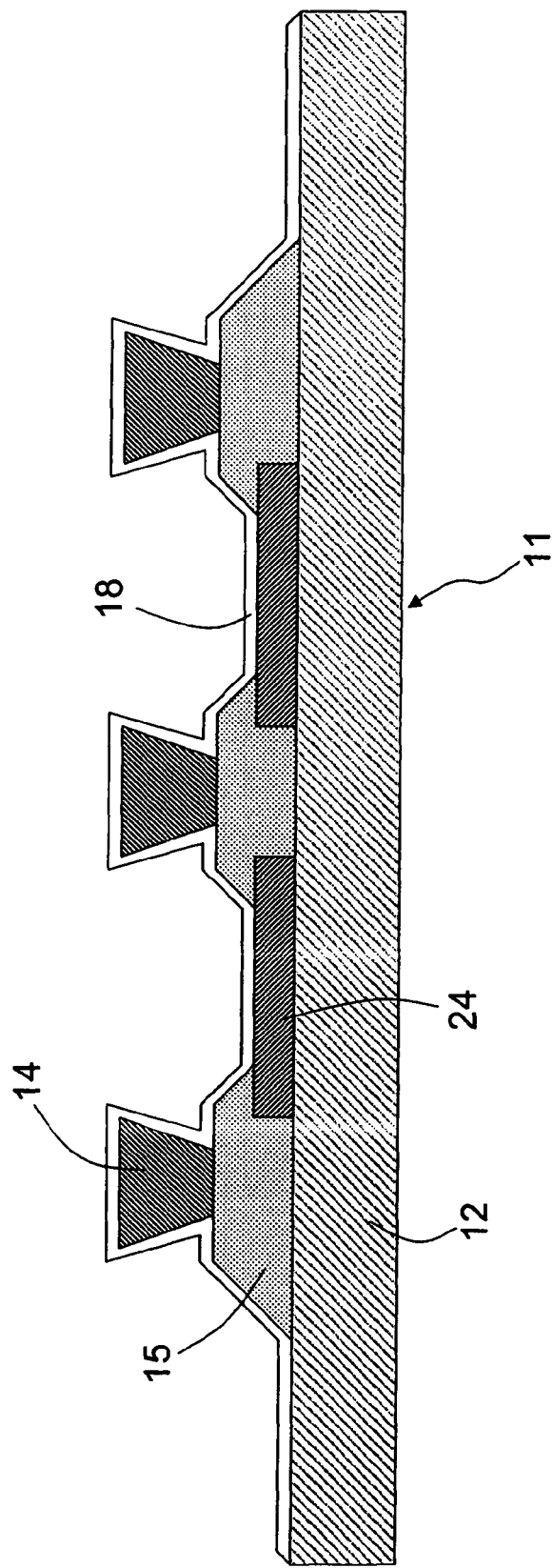
FIG. 2B is a cross-sectional view when a water-repellent layer is formed.
Figure 3:
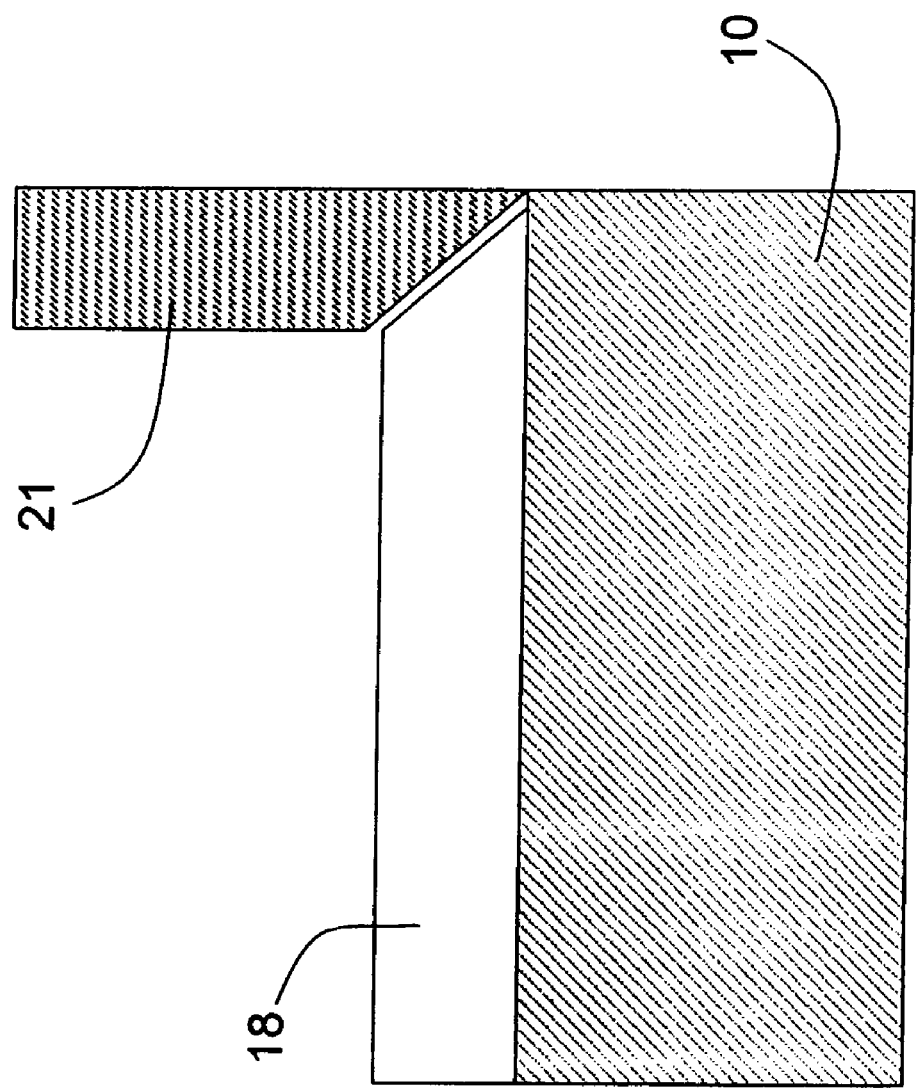
FIG. 3 is a cross-sectional view illustrating a manner of forming a water-repellent layer.

(2) Next, as illustrated in FIG. 2B, a water-repellent layer 18 is formed on the barrier rib 14 and the lower layer electrode 24. For example, if the water-repellent layer 18 is formed of the fluorine-based resin, in the process of forming the water-repellent layer 18, an ambient gas is deposited on the upper surface and the lateral surfaces of the barrier rib 14 by generating a high-vacuum plasma (pressure: over 0.3 Pa, for example, 0.31 Pa~100 Pa) within a chamber filled with the fluoro-carbon based ambient gas. In this case, the water-repellent layer 18 on the lower layer electrode 24 has to be 10 nm or less. In order to allow the thickness of the water-repellent layer 18 to be thin near the end portion of the substrate 12, as illustrated in FIG. 3, it is preferable that the water-repellent layer 18 is formed after disposing a taper shaped mask 21 having a width that is tapered down towards the substrate 12.

After the barrier rib 14 is formed and before and/or when the water-repellent layer 18 is formed, and/or when the water-repellent layer 18 is formed, if moisture content within the chamber is determined to be 100 ppm or less, the amount of moisture absorbed into the barrier rib 14 can be restricted to be small.

(3) Next, as illustrated in FIG. 2C, a mask 20 having a plurality of holes 22 corresponding to the openings 14a is brought to contact with the barrier rib 14, with the water-repellent layer 18 being interposed therebetween.

When the mask 20 is brought to contact with the barrier rib 14, a magnet is disposed in the opposite surface with respect to a surface of the substrate 12 on which the barrier rib 14 is formed, and then the mask 20 is closely attached to the water-repellent layer 18 on the barrier rib 14. If the location of the mask 20 is fixed by magnetic force of the magnet in this manner, the mask 20 is formed of a magnetic substance such as Ni alloy, No—Co alloy, or Fe—Ni—Co alloy.

When aligning the substrate 12 and the mask 20, alignment marks respectively disposed thereto are photographed by a CCD camera, and deviation between the substrate 12 and the mask 20 is calculated from its relative distance. Then, the mask 20 is moved by the calculated result.

Figure 2D:
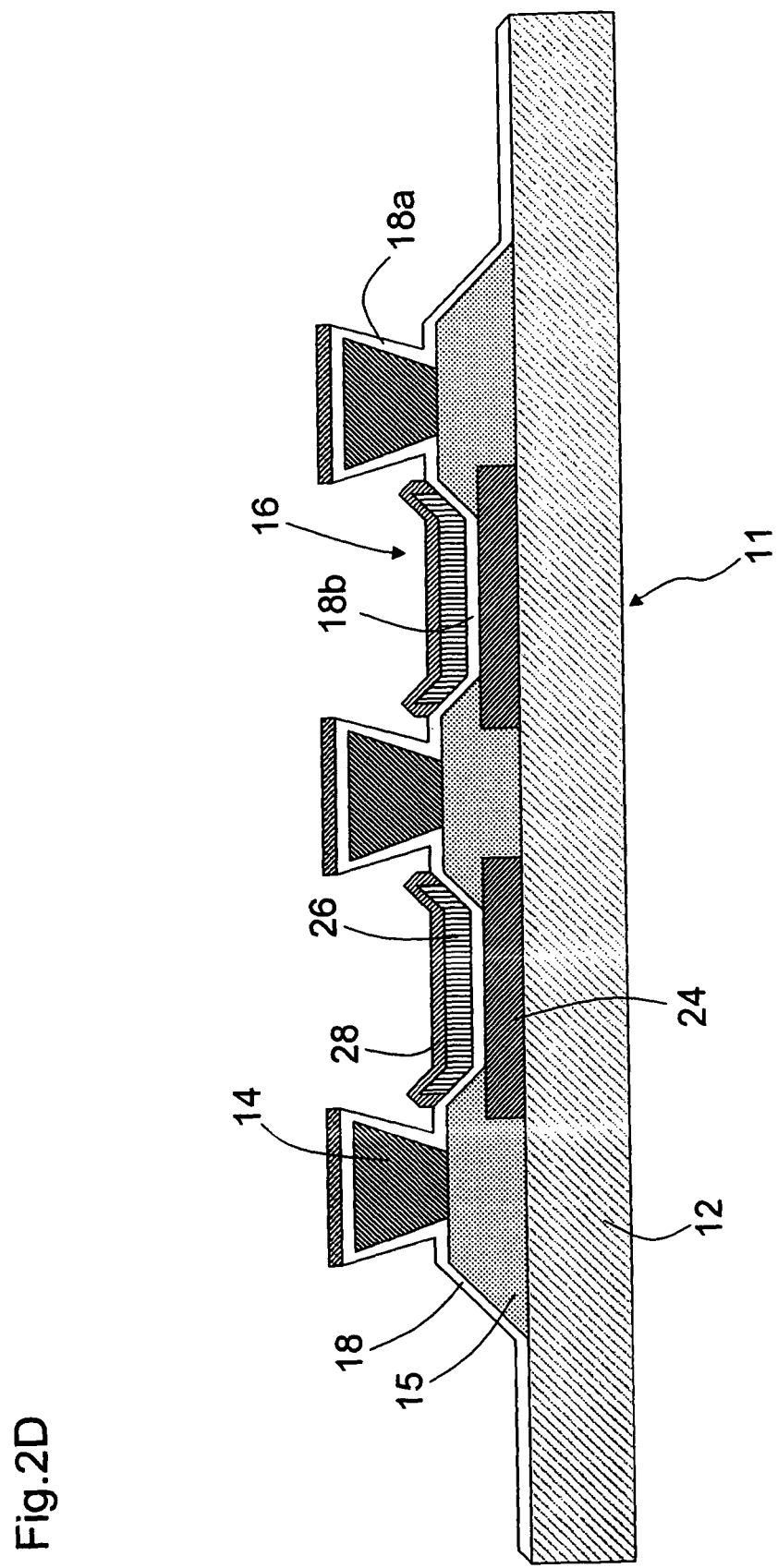
FIG. 2D is a cross-sectional view when an organic EL element is formed.

(4) Next, as illustrated in FIG. 2D, the organic EL elements 16 are formed by performing deposition using the mask 20.

Specifically, a deposition source having a deposition material is disposed below the mask 20 (in the opposite direction with respect to the substrate 12), and the deposition source is heated to evaporate the deposition material. The evaporated deposition material is deposited on the substrate 12 within the openings 14a by the use of the holes of the mask 20. In this manner, the organic layer 26 and the upper layer electrode 28 are sequentially laminated on the lower layer electrode 24. The deposition material may be an organic material constituting the organic layer 26, or a metal material (e.g. Ca, Mg, LiF/Al, AlLi, etc) constituting the upper layer electrode 28.

Figure 2E:
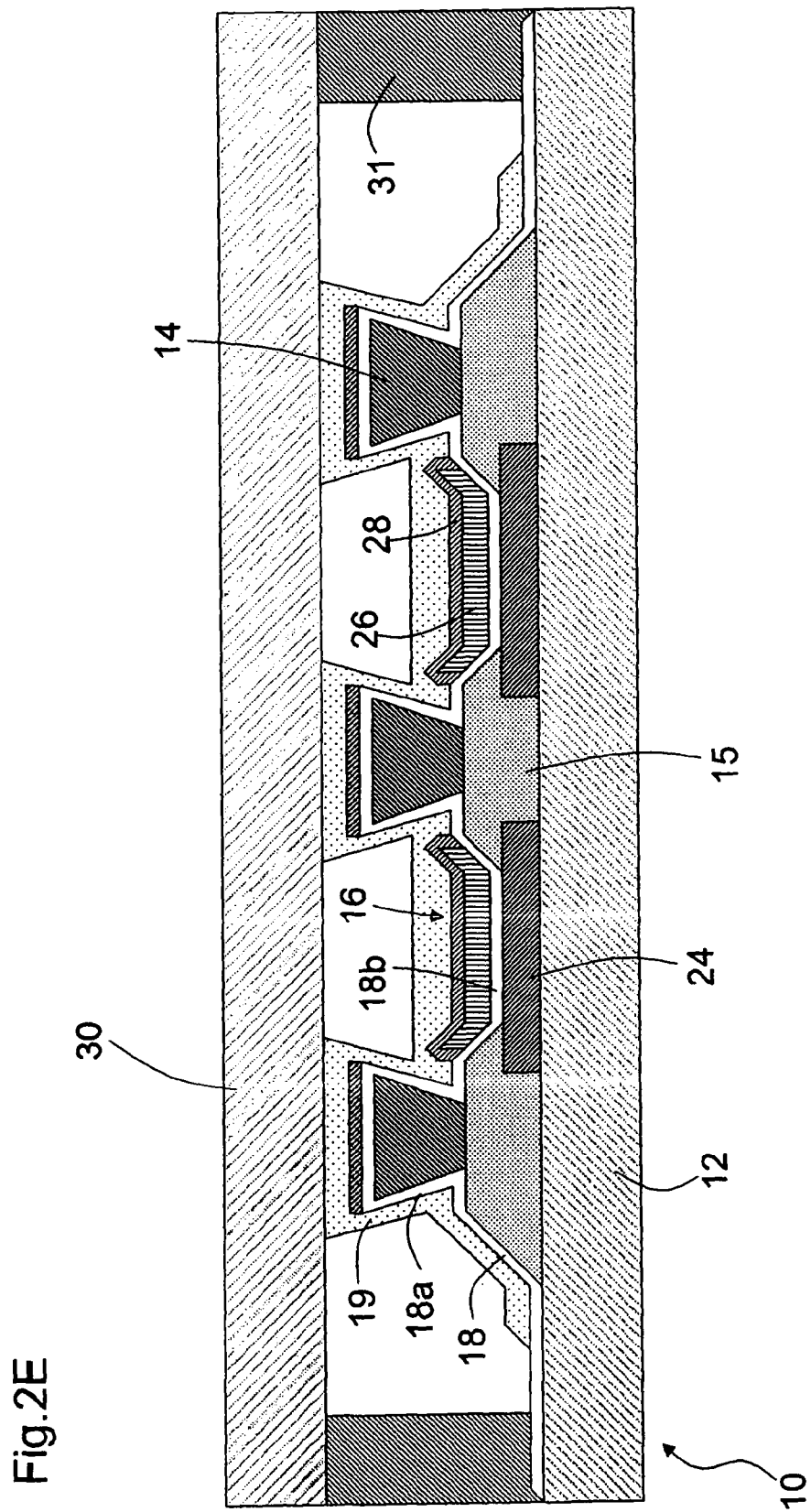
FIG. 2E is a cross-sectional view illustrating a manufactured organic EL display.

(5) The protection layer 19, which protects the organic EL element 16 and is formed of a SiN-based inorganic material, a SiO-based inorganic material, etc, is being formed on the water-repellent layer 18 by the CVD. The organic EL elements 16 and the protection layer 19 are sealed by the sealing substrate 30 and the sealing material 31, thereby completing the organic EL display 10 (FIG. 2E).

In the aforementioned steps (3) to (5), the moisture absorbed into the barrier rib 14 may be evaporated and discharged out of the barrier rib 14 due to an increase in an external temperature, a change in an internal pressure of the display 10, etc. However, in the present embodiment, since the water-repellent layer 18 is sequentially connected from the surface of the barrier rib 14 to the surface of the lower layer electrode 24, the moisture discharged out of the barrier rib 14 is restricted from reaching the organic layer 26 of the organic EL element 16. Accordingly, the lifespan of the organic EL display can be prolonged.

As described above, according to the first embodiment of the invention, since the water-repellent layer 18 is formed on the surface of the barrier rib 14, the barrier rib 14 can be restrained from absorbing moisture in a satisfactory manner when manufacturing the organic EL display. Moreover, even if the moisture absorbed into the barrier rib 14 is evaporated after the manufacturing process of the organic EL display is completed, and is then discharged out of the barrier rib 14, the moisture discharged out of the barrier rib 14 can be kept between the water-repellent layer 18 and the barrier rib 14, or between the water-repellent layer 18 and the lower layer electrode 24, thereby restricting the moisture from reaching the organic layer 26. Accordingly, the deterioration of the organic layer 26 can be significantly restricted, and thus the organic EL display having a long lifespan can be achieved.

In addition, since the thickness of the water-repellent layer 18 located between the lower layer electrode 24 and the organic layer 26 is 10 nm or less, consumption power required for emission of the organic element EL 16 can be sufficiently restricted from increasing.

In addition, since the water-repellent layer 18 is sequentially connected over the entire surface of the substrate 12, the water-repellent layer 18 is not easily peeled. Further, according to the first embodiment, since the thickness of the water-repellent layer 18 is thin near the end portion of the substrate, inner stress of the water-repellent layer 18 is reduced, which effectively prevents the water-repellent layer 18 from peeling.

In addition, according to the first embodiment, if ambient moisture content before and/or after the water-repellent layer 18 is formed is determined to be 100 ppm or less, the amount of moisture absorbed into the barrier rib 14 can be reduced. As a result, the lifespan of the organic EL display can be further prolonged.

Although the organic layer 26 is used as a function layer in the first embodiment, the function layer may be not only the organic layer but also an inorganic layer. In this case, the inorganic layer is preferably a hole injection layer and/or an electron injection layer. The inorganic layer may be formed of lithium fluoride, calcium fluoride, titanium dioxide, nickel oxide, molybdenum oxide, or vanadium oxide.

Figure 4:
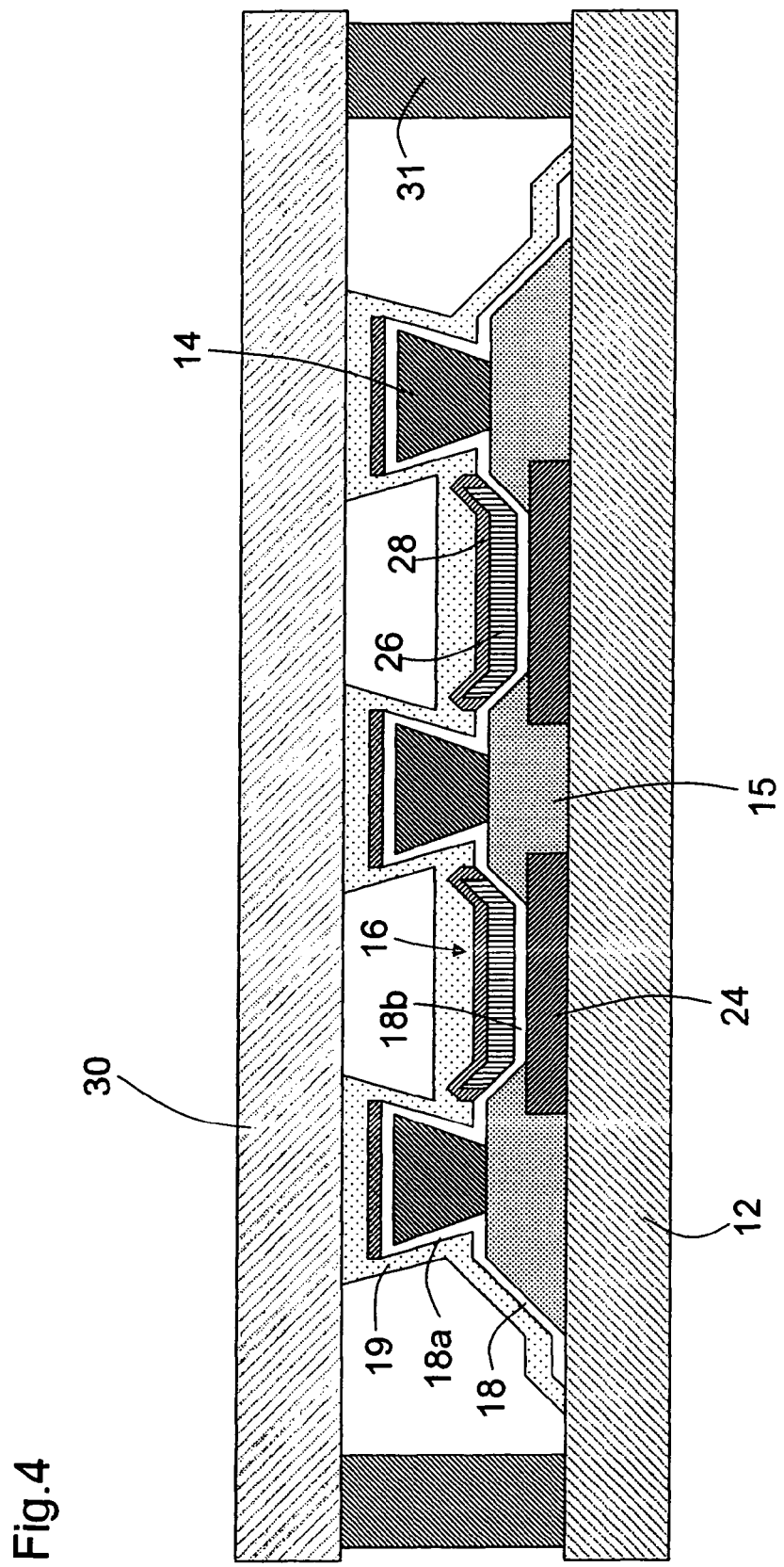
FIG. 4 is a cross-sectional view illustrating a modified organic EL display according to the first embodiment of the invention.

In addition, in the first embodiment, as illustrated in FIG. 4, the periphery of the water-repellent layer 18 may be located inwards the periphery of the protection layer 19. When the water-repellent layer 18 includes fluorine, the water-repellent layer 18 is not much strongly adhered to other materials. If the organic EL display has a structure of FIG. 4, the end portion of the protection layer 19 can be attached to the substrate 12 without having to interpose the water-repellent layer 18. Thus, even when the water-repellent layer 18 is formed, the protection layer 19 can have a high adhesive property with respect to the substrate 12. As a result, it is possible for the protection layer 19 to have a further increased sealing property with respect to the protection layer 19.

In addition, in the first embodiment, as shown in FIG. 4, the water-repellent layer 18 may not be deposited to a region where the sealing material 31 is formed, and the periphery of the water-repellent layer 18 may be disposed inwards with respect to the sealing material 31. In this case, the sealing material 31 can be also deposited to the substrate 12 without having to interpose the water-repellent layer 18. As a result, the sealing material 31 can maintain a high adherence property with respect to the substrate 12, and thus a space surrounded by the substrate 12, the sealing substrate 30, and the sealing materiel 31 can be maintained in an airtight manner.

Second Embodiment

In an organic EL display according to a second embodiment of the invention, unlike in the first embodiment, as illustrated in FIG. 5, the interlayer insulation film 15 is used as an insulation member that divides the adjacent organic EL elements 16. Even in a structure in which the barrier rib 14 is omitted, if the interlayer insulation film 15 is formed by an organic resin, the formation of the water-repellent layer 18 is effective similarly to the case of the first embodiment since the interlayer insulation film 15 can easily absorb moisture. In this case, the water-repellent layer 18 is sequentially deposited from the surface of the lower layer electrode 24 to the surface of the interlayer insulation film 15.

Therefore, in the interlayer insulation film 15, the water-repellent layer 18 restrains moisture from absorbing into the organic layer 26 in a satisfactory manner even when the inter-insulation layer 15 absorbs the moisture in a condition that the moisture is not easily absorbed during a manufacturing process of the organic EL display. In addition, since the barrier rib 14 can be omitted, the structure of the organic EL display can be simplified.

A concave portion 15a is disposed in the upper surface of the interlayer insulation film 15. Since the width of the concave portion 15a is wider in its lower portion than its upper portion, the upper layer electrode 28 is divided by the concave portion 15a in a satisfactory manner. Thus, electrical insulation between the adjacent organic EL elements 16 can be maintained in a satisfactory manner. When the concave portion 15a is formed, it is preferable that the first protection layer 18 is formed along the inner surface of the concave portion 15a, in terms of avoiding moisture absorption into the interlayer insulation film 15 or moisture discharge from the organic layer 26.

The invention is not limited to the first and second embodiments and various changes in form and details may be made therein without departing from the spirit and scope of the invention.

What is claimed is:

1. An organic EL display comprising:
    a substrate;
    a plurality of organic EL elements arranged on the substrate and having a lower layer electrode, an upper layer electrode and a function layer interposed between the lower and the upper layer electrodes, the function layer including an organic light emitting layer;
    an insulation member disposed between the adjacent organic EL elements; and
    a first protection layer sequentially formed from a region between the lower layer electrode and the function layer to a surface of the insulation member, and comprising fluorine.

2. The organic EL display of claim 1, wherein a thickness of the first protection layer is 10 nm or less in the region between the lower layer electrode and the function layer.

3. The organic EL display of claim 1, wherein the first protection layer has a composition of $CH_xF_y$, ($0 \leq x \leq 1$, $0.3 \leq y \leq 2$, $1.3 \leq x+y \leq 2$).

4. The organic EL display of claim 1, wherein the first protection layer is formed substantially over an entire surface of the substrate.

5. The organic EL display of claim 4, wherein the first protection layer is tapered down near an end portion of the substrate.

6. The organic EL display of claim 1, further comprising a second protection layer which covers the organic EL elements,
    wherein a periphery of the first protection layer is located inwards with respect to a periphery of the second protection layer.

7. The organic EL display of claim 1, further comprising:
    a sealing substrate disposed on the substrate; and
    a sealing material interposed between the substrate and the sealing substrate, and surrounding a region where the plurality of organic EL elements are arranged,
    wherein a periphery of the first protection layer is located inwards with respect to a region where the sealing material is formed.

8. An organic EL display comprising:
    a substrate;
    a plurality of organic EL elements arranged on the substrate and having a lower layer electrode, an upper layer electrode and a function layer interposed between the lower and the upper layer electrodes, the function layer including an organic light emitting layer;
    an insulation member disposed between the adjacent organic EL elements; and
    a first protection layer sequentially formed from a region between the lower layer electrode and the function layer to a surface of the insulation member, and comprising a water-repellent material.

9. The organic EL display of claim 8, wherein the thickness of the first protection layer is 10 nm or less in the region between the lower layer electrode and the function layer.

10. The organic EL display of claim 8, wherein the first protection layer comprises fluorine.

11. The organic EL display of claim 10, wherein the first protection layer has a composition of $CH_xF_y$, ($0 \leq x \leq 1$, $0.3 \leq y \leq 2$, $1.3 \leq x+y \leq 2$).

12. The organic EL display of claim 8, wherein the first protection layer is formed substantially over an entire surface of the substrate.

13. The organic EL display of claim 8, wherein the first protection layer is tapered down near an end portion of the substrate.

14. The organic EL display of claim 8, further comprising a second protection layer which covers the organic EL elements,
    wherein a periphery of the first protection layer is located inwards with respect to a periphery of the second protection layer.

15. The organic EL display of claim 8, further comprising:
    a sealing substrate disposed on the substrate; and
    a sealing material disposed between the substrate and the sealing substrate, and surrounding a region where the plurality of organic EL elements are arranged,
    wherein the periphery of the first protection layer is located inwards with respect to a region where the sealing material is formed.

* * * * *